(12) United States Patent
Ghezzi et al.

(10) Patent No.: US 6,396,168 B2
(45) Date of Patent: May 28, 2002

(54) PROGRAMMABLE LOGIC ARRAYS

(75) Inventors: Stefano Ghezzi, Treviolo; Donato Ferrario, Carugate; Emilio Yero, Vimercate; Giovanni Campardo, Bergamo, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/782,173

(22) Filed: Feb. 12, 2001

(30) Foreign Application Priority Data

Feb. 14, 2000 (EP) .............................. 00830102

(51) Int. Cl.[7] .......................................... H03K 19/096
(52) U.S. Cl. ............................ 307/44; 326/41; 326/112
(58) Field of Search .............................. 326/39, 40, 41, 326/44, 93, 112, 119, 121

(56) References Cited

U.S. PATENT DOCUMENTS

| 4,142,176 A | * | 2/1979 | Dozier | ..................... 326/112 |
| 4,661,728 A | | 4/1987 | Kashimura | ................... 307/468 |
| 4,725,745 A | | 2/1988 | Kondo et al. | ............... 307/465 |
| 5,083,047 A | * | 1/1992 | Horie et al. | .................. 326/112 |
| 6,137,318 A | * | 10/2000 | Takaaki | ....................... 326/112 |

FOREIGN PATENT DOCUMENTS

EP 0254474 1/1988 ......... H03K/19/177

* cited by examiner

*Primary Examiner*—Michael Tolar
*Assistant Examiner*—Don Phu Le
(74) *Attorney, Agent, or Firm*—Lisa K. Jorgenson; Allen, Dyer, Doppelt, Milbrath & Gilchrist, P.A.

(57) ABSTRACT

A programmable logic array (PLA) includes at least one AND plane including an array of transistors arranged in rows and columns. The transistors belonging to a same column may be connected in series with each other. Two end conduction terminals of the series connected transistors may be coupled to a supply voltage rail and to a reference, respectively. The transistors of the first and last rows of the array may have their control terminals coupled to respective opposite enabling/disabling potentials. Except for the first and last rows, first, second, and third control lines are associated with each row of the array. Except for the first and last rows, each transistor of each row may have its control terminal connected to one of the three control lines associated with its row. The PLA may alternatively include at least one OR plane.

6 Claims, 7 Drawing Sheets

$i*p + i + 2(p+1) = 7*9 + 7 + 2*(9+1) = 90$ transistors
$i$ = inputs — $p$ = products

FIG. 3
PRIOR ART

PRODUCTS

|  | A | B | C | D | E | F | G | H | K |  |
|---|---|---|---|---|---|---|---|---|---|---|
| STATE(0) | 0 | 0 | 0 | 1 | 1 | 0 | 1 | 0 | 1 | |
| STATE(1) | 0 | 0 | 0 | 0 | 0 | 1 | 1 | 0 | 0 | |
| STATE(2) | 0 | 0 | 0 | 0 | 0 | 0 | 0 | 1 | 1 | |
| IN(0) | 0 | 1 | 1 | 0 | – | – | 1 | 0 | 1 | AND PLANE |
| IN(1) | 0 | – | 1 | 0 | – | – | 0 | – | 1 | |
| IN(2) | 0 | – | 1 | 1 | – | – | 1 | – | 1 | |
| IN(3) | 0 | 0 | – | – | 1 | 0 | 0 | – | 1 | |
| OUT(0) | 0 | 0 | 0 | 1 | 0 | 1 | 0 | 0 | 0 | |
| OUT(1) | 0 | 1 | 0 | 0 | 1 | 1 | 0 | 0 | 0 | |
| OUT(2) | 0 | 0 | 0 | 0 | 1 | 1 | 1 | 1 | 0 | |
| OUT(3) | 0 | 1 | 1 | 0 | 0 | 0 | 0 | 0 | 0 | OR PLANE |
| OUT(4) | 0 | 0 | 1 | 0 | 0 | 0 | 0 | 0 | 0 | |
| FUTURE(0) | 0 | 1 | 0 | 0 | 1 | 1 | 1 | 1 | 0 | |
| FUTURE(1) | 0 | 0 | 0 | 1 | 1 | 1 | 0 | 0 | 0 | |
| FUTURE(2) | 0 | 0 | 1 | 0 | 0 | 0 | 1 | 1 | 0 | |

$2*i*p + 2*i + 2(p+1) = 2*7*9 + 2*7 + 2*(9+1) = 160$ transistors
$i$ = inputs - $p$ = products

PROGRAMMABLE LOGIC ARRAYS

FIELD OF THE INVENTION

The present invention relates to the field of electronic circuits such as reprogrammable memories, and, more particularly, to a programmable logic array including at least one AND plane or at least one OR plane.

BACKGROUND OF THE INVENTION

The design of logic circuitry may sometimes require the use of complex combinatorial circuitry that depends upon a clock signal. For example, this may be the case in a state machine that implements a sequential algorithm and has its combinatorial circuitry separated from its sequential storage circuitry. A basic scheme of a state machine may be seen in FIG. 1.

Current design approaches formulate the description of the state machine in a high level language (e.g., VHDL) to devise the algorithm. Once the methods are described in a language that may be synthesized (i.e., a high level language that can be interpreted by software to automatically synthesize the described logic network), the combinatorial circuitry can be implemented either with elementary logic gates or with a programmable logic array (PLA). These two solutions have their own advantages and disadvantages, the details of which are beyond the scope of the ensuing description.

What should be emphasized is that the implementation of logic gates is generally required and, as a result, the algorithm may not be modified in a simple manner. In fact, if a logic gate is to be implemented with complementary metal oxide semiconductor (CMOS) technology, the masks used for defining transistors will require modification, particularly the mask defining the active areas used during the first process step. On the other hand, by using a PLA the algorithm may be completely and simply changed by using a very limited number of masks and, therefore, process steps.

In other cases, such as that of FLASH erasable programmable read-only memories (EPROMs), reprogrammability is very important because the algorithm may sometimes require changes or updating during the life span of the device. This may occur during a debug phase or may follow from specific requirements which were not anticipated at the time of designing the device. Due to their relevance in the present context, the ensuing description will make reference to FLASH EPROM memories, although the invention may also be applied to other reprogrammable memories.

In order to clarify the technical problem overcome by the invention, reference is now made to FIG. 2. The nodes of the graph represent the states of the machine. Three bits individuate these states, whereas the branches labeled with the letters represent the state transitions.

A truth table of the machine of FIG. 2 is shown in FIG. 3. The states of the machine are coded by the variable STATE(0), STATE(1) and STATE(2) which represent the least significant bit, the intermediate bit and the most significant bit, respectively, of the group of three bits that individuate a certain current state. Variables FUTURE(0), FUTURE(1) and FUTURE(2) represent the least significant bit, the intermediate bit and the most significant bit, respectively, of the group of three bits that individuate a future state reached as a result of a certain transition. Variables OUT(n) and IN(n) represent the bits of the logic input and output logic signals of the machine corresponding to a certain transition. Dashes represent "don't care" symbols.

A hardware embodiment including a PLA implementing the truth table of FIG. 3 is shown in FIGS. 5 and 6. The PLA is built according to an AND-OR pre-charge and evaluation scheme. The combinatory circuitry COMBINATORIAL LOGIC that implements the PLA has 7 inputs, 9 minterms and 8 outputs.

As may be seen in FIG. 5, the AND plane of the PLA includes an array of transistors ordered in rows and columns. The transistors of a same column are connected in series through their respective current terminals, whereas the control terminals of the transistors belonging to the same row are connected in parallel. The top row of the array drives the start-up of the processing, whereas the bottom row extracts the computed values once the processing is completed.

The OR plane of the PLA, shown in FIG. 6, is instead formed by an array of transistors organized in row and columns which carry out the logic sum of the input minterms and by an output buffer. The transistors that belong to the same column of the array have their control terminals connected to a respective control line coupled to a certain minterm and a first current terminal connected to a reference potential. Also, the transistors of a same row have their second current terminal either connected or not to a respective output line. The output buffer (which appears on the left hand side of the figure) includes a column of inverters, each of which is connected to a respective output line and to a respective enabling transistor connected between the respective output line and the supply voltage VDD.

The PLA is a pre-charge and evaluation circuit. That is, the internal nodes are first pre-charged and then discharged during the evaluation phase if the input pattern corresponds to the expected one. To ensure that the outputs are read at the instant they assume a valid value (i.e., only when all the transistors function in a steady state), the PLA is provided with a dummy path DUMMY, as seen in FIGS. 5 and 6, that is designed to be the slowest of all paths. This dummy path DUMMY includes a set of as many transistors as the number of independent logic variables needed to implement the machine.

Because the dummy path has the largest number of transistors among the various paths of the PLA, it will consequently also be the slowest to reach a steady state of operation. Therefore, when a signal propagates through all the dummy path's transistors, all of the other input signals will have propagated through their respective paths and the evaluation phase may thereby be completed.

A possible timing diagram of the signals represented in the table of FIG. 3 relative to the "E" transition is shown in FIG. 4. The pre-charge phases of the AND (CPPA) and OR (CPPO) plane are active low and are out-phased among them. This is so that the output of the AND plane of the PLA may reach a steady state before the start of the processing carried out by the OR plane of the PLA. Before the CPPA signal enables the AND plane, the variables STATE(n) and IN(n) assume their respective values. Once the charge phase is completed with the disabling of the CPPO signal, the outputs OUT(n) and FUTURE(n) assume their respective final values. These are read only when the DUMMY path reaches a steady state and has delivered an OUTDUMMY output signal.

As shown in FIGS. 5 and 6, a combinatorial network having an "i" number of input variables may be realized with a PLA with 2*I inputs, i.e., the "i" input variables plus their respective inverted logic signal. This occurs because in order to ensure the programmability of the PLA the input variables and the respective inverted logic signals should be available.

Let us consider a AND-OR PLA with 2*I inputs, "p" minterms and "o" outputs, for example. To implement the AND plane on silicon there must be enough space for 2*i*p transistors for the content, 2*i transistors for the DUMMY PATH, 2*(p+1) transistors for the pre-charge of the minterms, and p inverters. In order to implement an OR plane there must be enough silicon area for o*p transistors for the content, o+p+1 transistors for the DUMMY PATH, o+1 transistors for the pre-charge of the minterms, and o+1 inverters.

Referring to FIG. 5, different space intervals between the transistors of a same column are shown for convenience, i.e., transistors are shown at some locations while at other locations only short-circuits are shown. In reality, the transistors of the PLA are uniformly distributed on the silicon surface. However, only those transistors that do not form a minterm are short-circuited and they are depicted in the figure as simple short-circuits, whereas the transistors corresponding to the variables present in a minterm have been depicted. These transistors may have minimum dimensions because they are designed for a specific requirement in a restricted area, and therefore have a small parasitic load.

The reprogramming process is implemented by modifying the connection of only one terminal of the transistors of the AND plane and of the OR plane. In the AND plane, the gates of the transistors are shown where they correspond to a true signal ("1" in the truth table) and an inverted signal ("0" in the truth table), but they are not shown where they correspond to "don't cares" ("–" in the truth table). In the OR plane, the transistors are shown omitting some of the contacts that connect them to the output line. The contacts are either shown if the output is conditioned by the minterm considered ("1" in the truth table) or not if the minterm does not connect to the output line ("0" in the truth table).

In summary, in the above type of PLA, a reprogramming of the entire algorithm may be implemented by establishing or not certain connections using poly gate and contact masks. Yet, current architectures have several drawbacks. As discussed above, the AND plane requires a silicon area of 2*i*p transistors for the logic content of the plane. However, it is evident that to implement any minterm there is no need for "i" inputs because an input and its logic inverted value are never used simultaneously in the same minterm. A silicon area of i*p transistors should be theoretically sufficient to realize any minterm. Therefore, there exists a silicon area reserved to i*p transistors that always remains unused.

A second drawback relates to the fact that the drain nodes of the unused transistors of the OR plane remain floating. This is a condition that should be avoided in VLSI circuits. A third problems relates to the requirement for having two distinct masks to reprogram this type of PLA. That is, one mask for the AND plane and another one for the OR plane. It would certainly be more cost effective to use the same mask for both planes. Finally, the dummy path is solely to used for determining when to read the PLA outputs since the different paths are characterized by different signal propagation times.

SUMMARY OF THE INVENTION

It is an object of the present invention to provide an architecture for an AND plane and/or an OR plane of a logic programmable array (PLA) that reduces the above drawbacks of known PLAs and has signal propagation times along the various paths that are independent from the specific programming of the PLA, thus eliminating the need for a dummy path and reducing the area required for implementation.

This and other objects, features, and advantages according to the present invention are provided by a logic programmable array (PLA) including at least an AND plane including an array of transistors arranged in rows and columns. The transistors belonging to a same column are electrically connected in series. Opposite end conduction terminals of the series transistors are coupled to a supply voltage (VDD) and to a reference potential (GND), respectively. Further, the transistors of the first row and of the last row of the array have their control terminals connected to respective enabling potentials.

With the exception of the two extreme rows, each of the other rows of the array is associated with three different control lines. A first line is coupled to a first input value, a second line is coupled to a logic inverted value of the first input value, and a third line is coupled to a potential that maintains in a state of conduction the transistors connected to it. Each transistor of each non-extreme row has its control terminal connected to one of the three control lines. Optionally, the AND plane of the PLA of the invention may have a column (DUMMY) of transistors. With the exception of the transistors belonging to the two extreme rows, the control terminals of the column (DUMMY) are coupled to a voltage that maintains them in a conduction state.

According to another embodiment, the logic programmable array (PLA) of the invention may have at least an OR plane including an array of transistors arranged in rows and columns. The transistors belonging to a same column have their control terminals connected to a respective control line and a first current terminal coupled to a reference voltage (GND). Each transistor of each row of the array has a second current terminal connected or not to a respective output line, and those not connected to a respective output line are short-circuited to the respective first current terminal. The OR plane of the PLA of the invention may optionally have a column (DUMMY) of transistors whose control terminals are connected to a respective control line, while the current terminals are coupled to the reference potential (GND).

BRIEF DESCRIPTION OF THE DRAWINGS

The different aspects and advantages of the invention will become even more evident through the following description of preferred embodiments and upon referring to the attached drawings, wherein:

FIG. 3 is a truth table of the machine of FIG. 1;

DETAILED DESCRIPTION OF THE PREFERRED EMBODIMENTS

Figure 1:
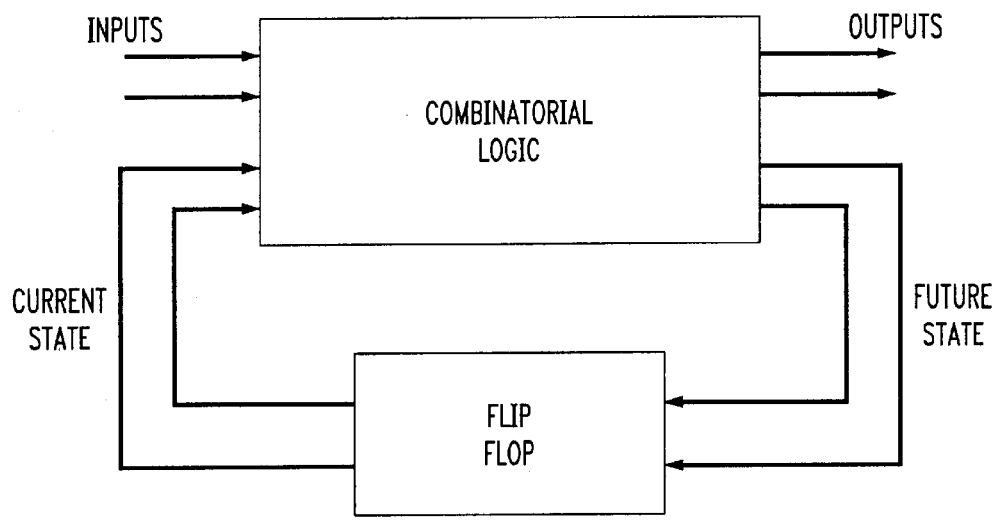
FIG. 1 is a schematic block diagram of a finite state machine according to the prior art.
Figure 2:
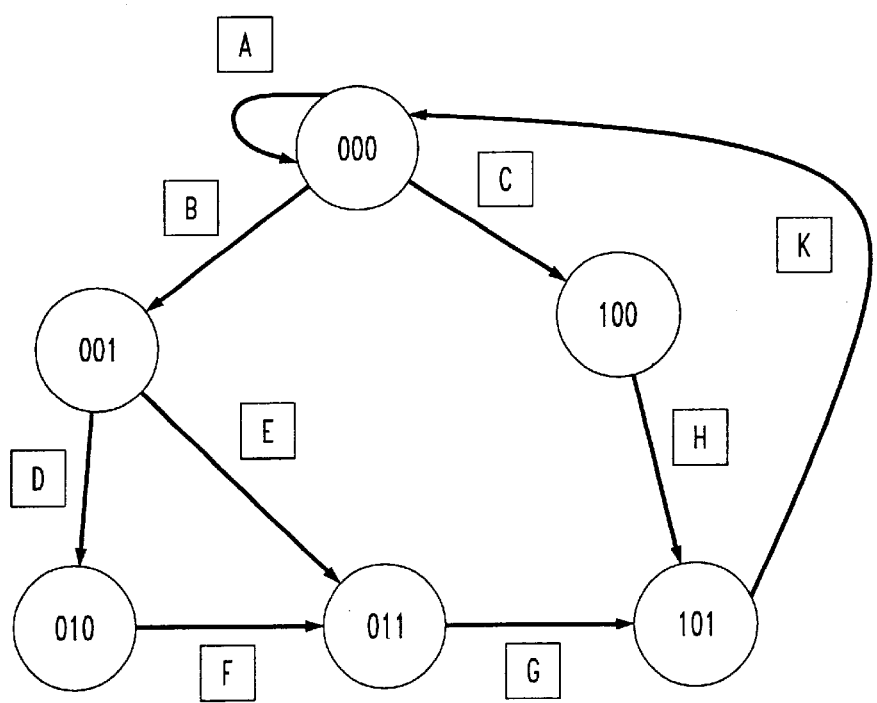
FIG. 2 is a state diagram illustrating sample transitions of the finite state machine of FIG. 1.
Figure 4:
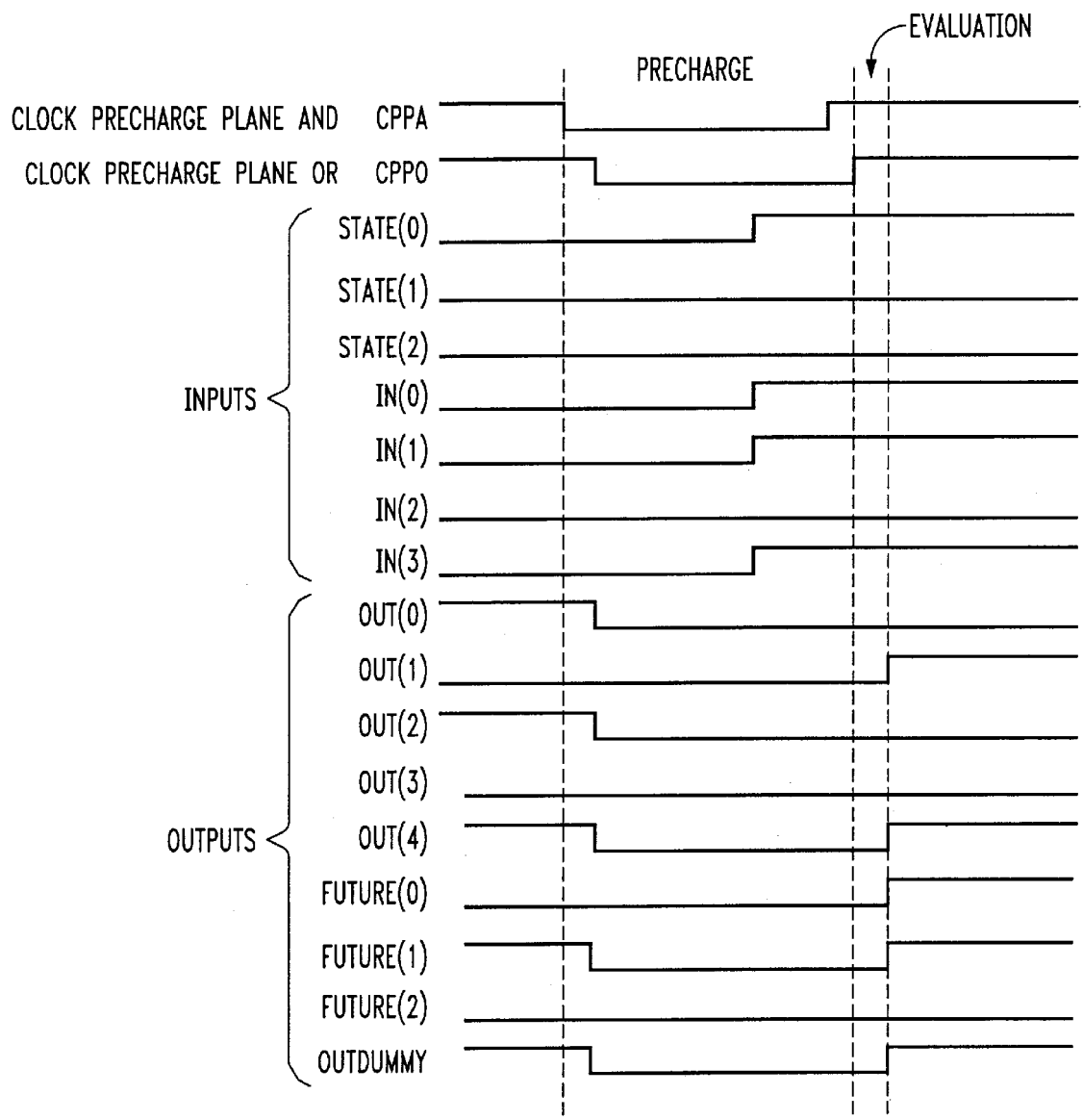
FIG. 4 is a timing diagram of a possible arrangement of signals involved in the "E" transition of FIG. 2.
Figure 5:
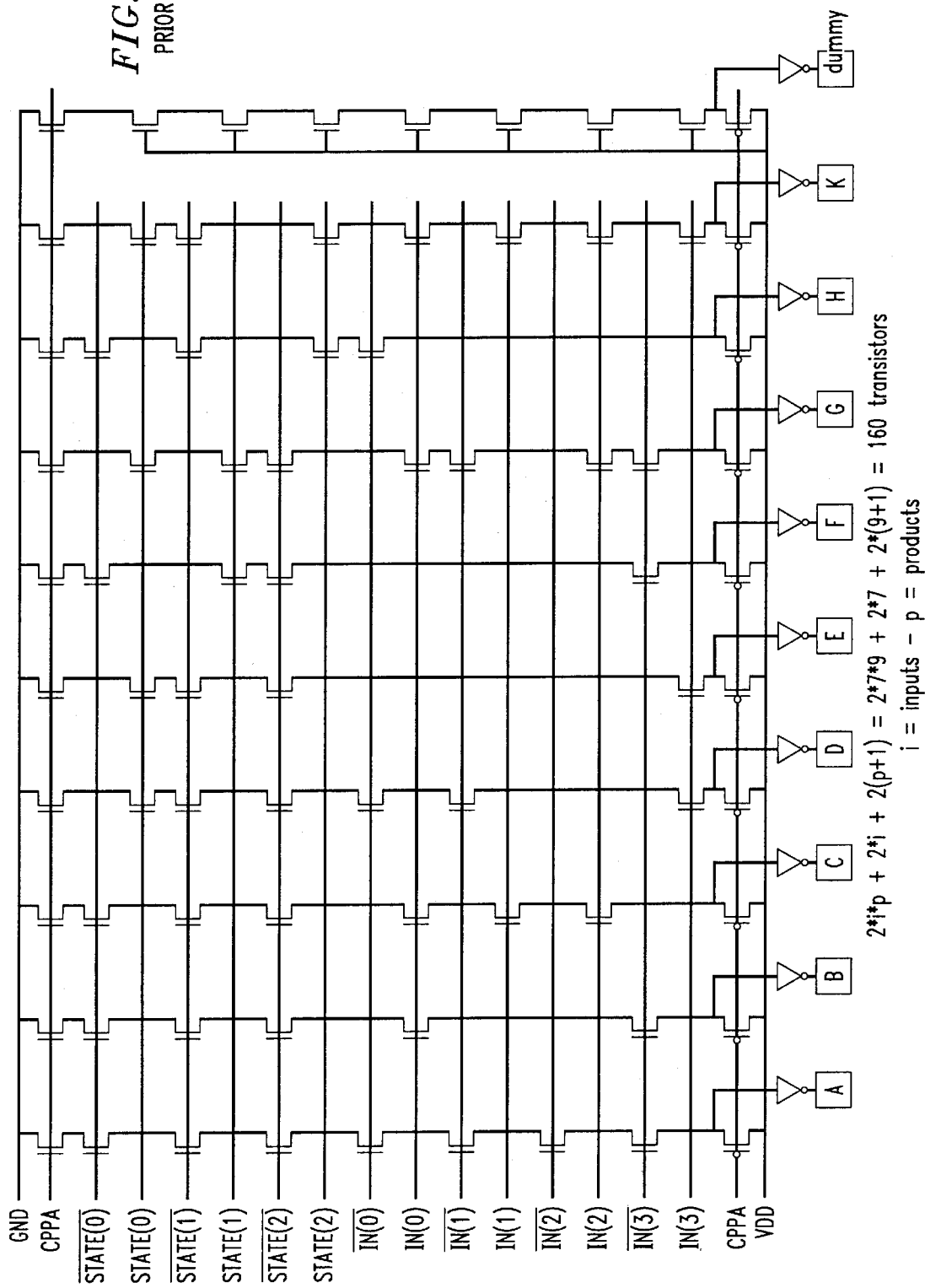
FIG. 5 is a schematic diagram of the AND plane of a PLA according to the prior art used to implement the machine of FIG. 1.
Figure 6:
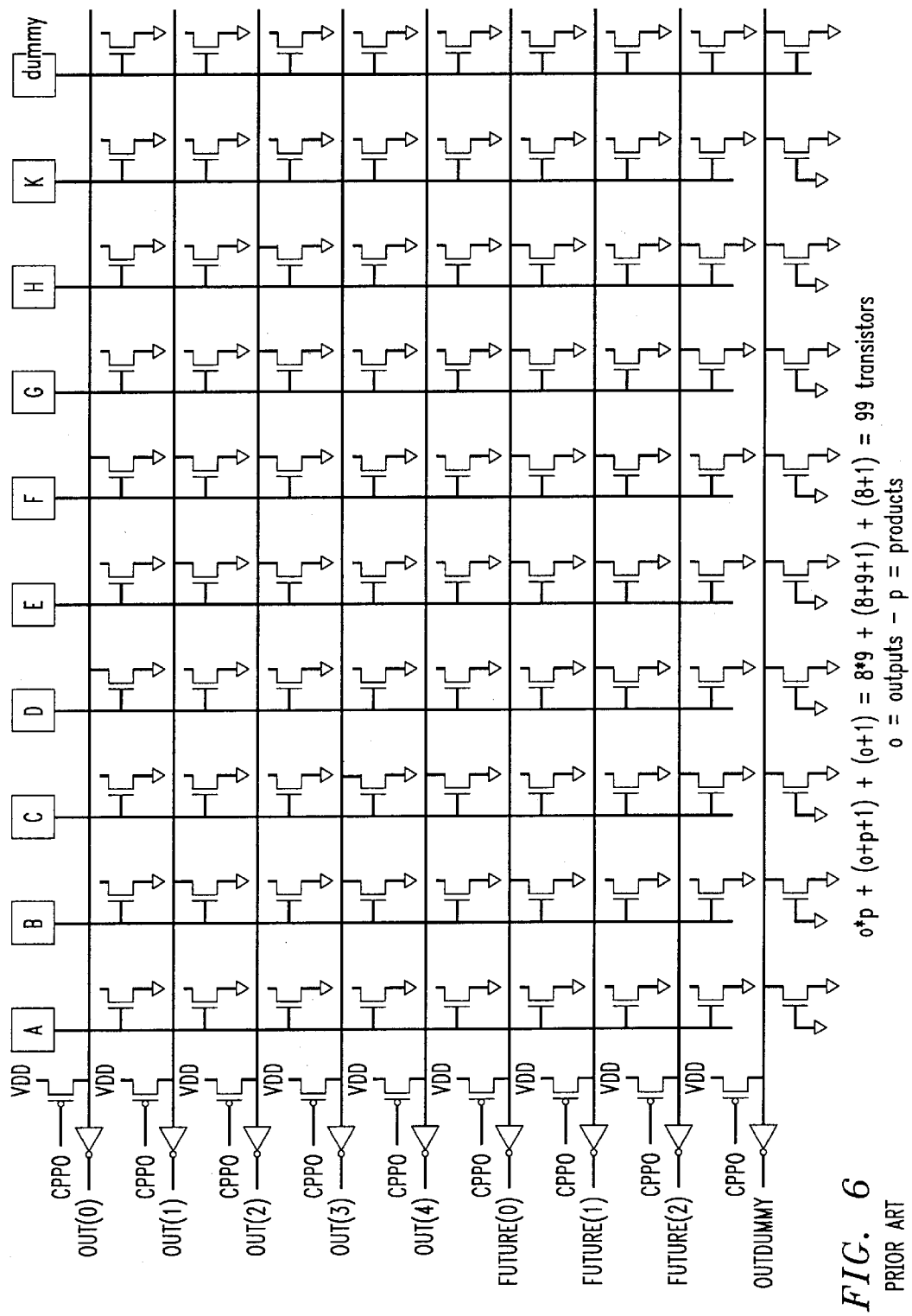
FIG. 6 is a schematic diagram of the OR plane of a PLA according to the prior art used to implement the machine of FIG. 1.
Figure 7:
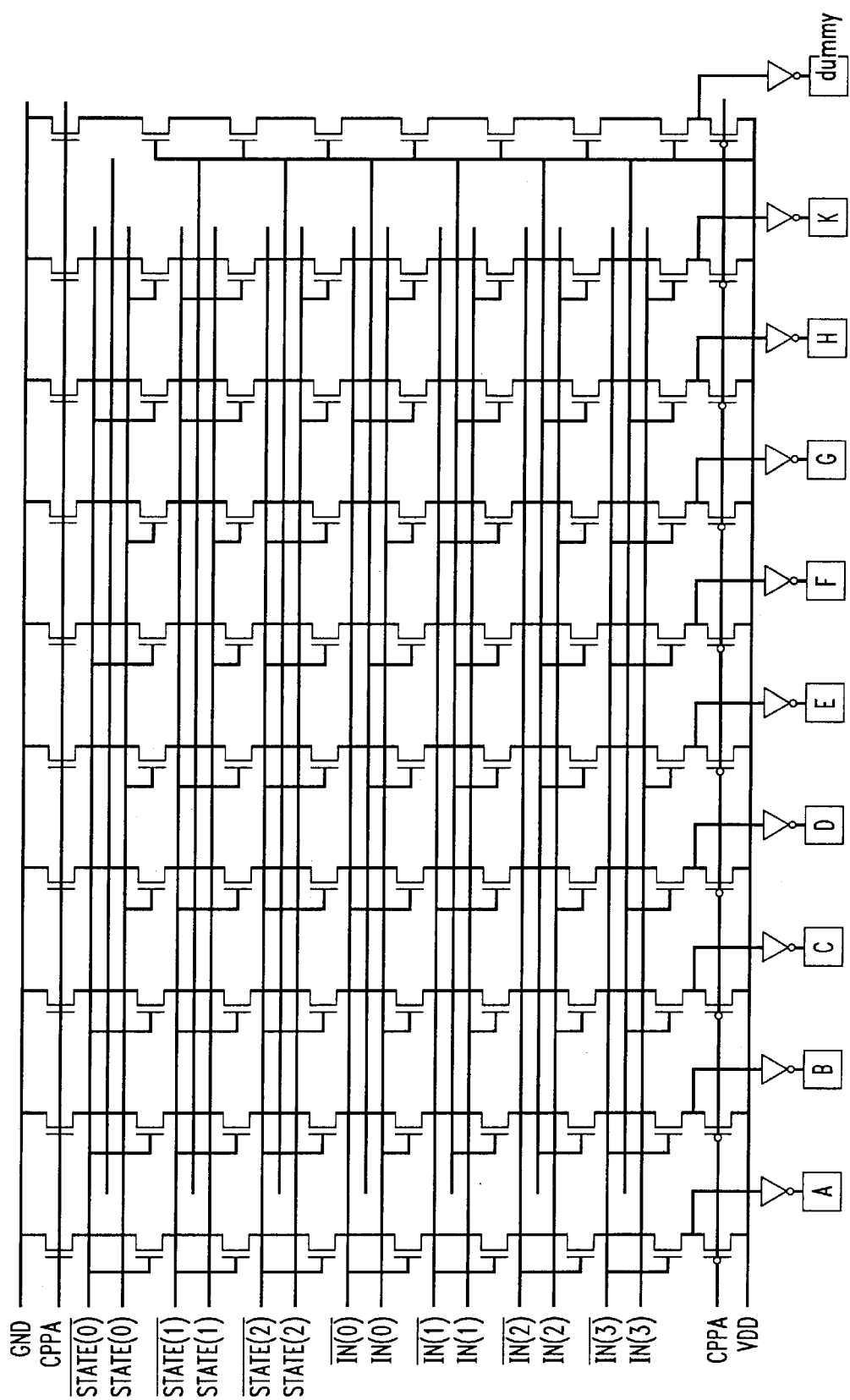
FIG. 7 is a schematic diagram of an AND plane of a PLA according to the present invention that may be used to implement the machine of FIG. 1.

According to the present invention, a PLA including at least an AND plane or an OR plane can be made with a reduced amount of silicon area. Instead of having a transistor on an input line or on the inverted input line, or no transistor at all, the AND plane of the PLA of the invention has a transistor whose gate is either connected to the input line, the inverted input line, or the supply node (in which case the transistor is kept in a conduction state), as shown in FIG. 7. Hence, the AND plane requires a silicon integration area for i*p transistors for the logic circuitry, 2*i transistors for the DUMMY path, 2*(p+1) for the pre-charge of the minterms, and p inverters.

That is, the logic circuitry requires a silicon area of i*p transistors rather than 2*i*p transistors, as in the PLAs of the prior art. Therefore, for the same area occupied by each transistor, and for implementing a certain Boolean function, the PLA of the invention occupies less space than a known PLA.

A further advantage is that each column of the AND plane has the same number of transistors in series, and thus each minterm requires the same time to be evaluated. This substantially guarantees that all the outputs reach their final value at essentially the same instant. This may even permit (if so desired) the implementation of a simple and convenient external timing instead of a more burdensome DUMMY path. A PLA implemented with such an AND plane may be reprogrammed through a first metalization level.

Figure 8:
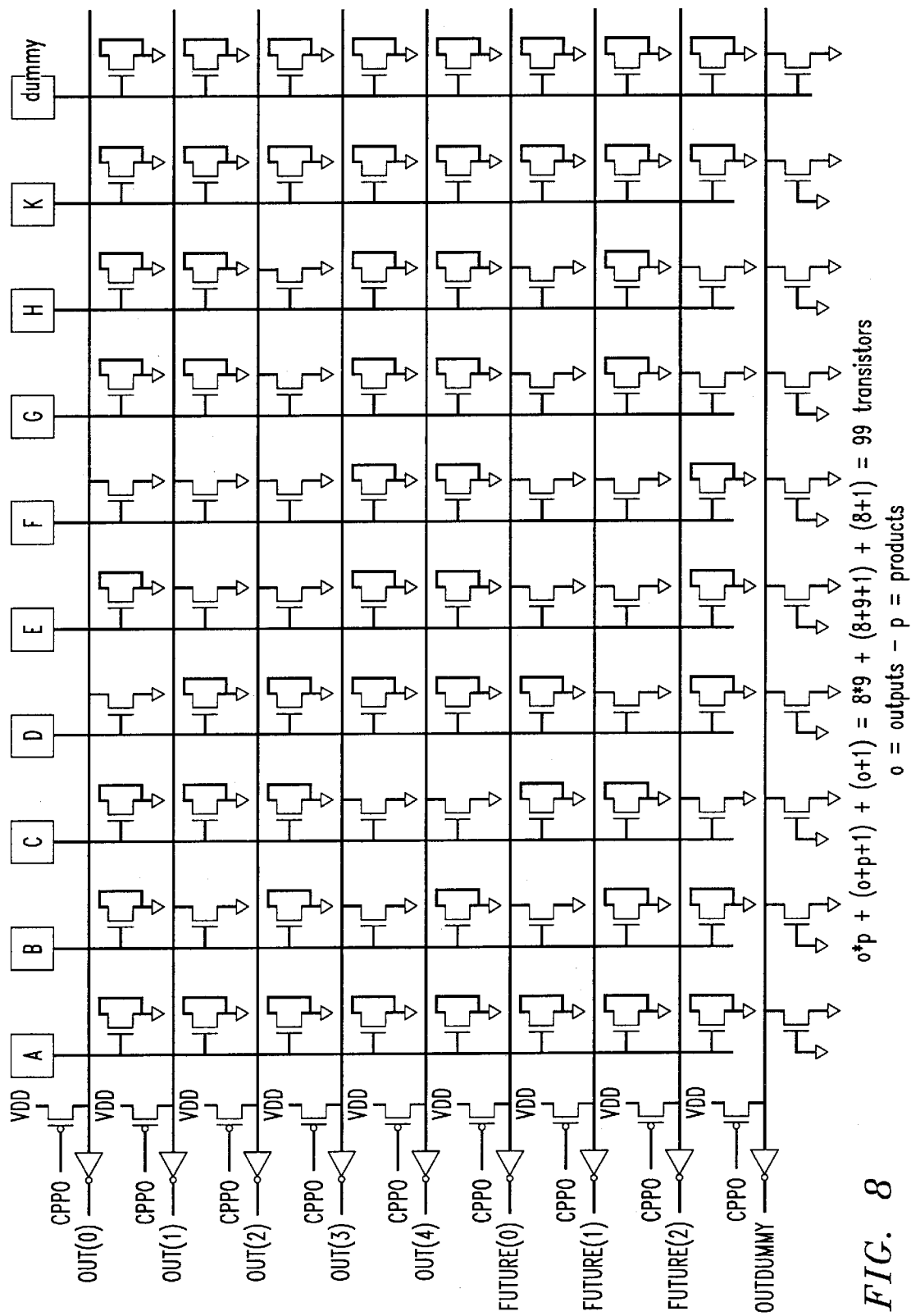
FIG. 8 is a schematic diagram of an OR plane of a PLA according to the present invention that may be used to implement of the machine of FIG. 1.

According to another embodiment, an OR plane of a PLA according to the invention is characterized in that the unused transistors have their drain and source short-circuited to each other and coupled to ground, as may be seen in FIG. 8. Therefore, contrary to what occurs in a prior art PLA, the presence of floating potentials is substantially avoided. As with the AND plane, the OR plane may also be reprogrammed through the first metalization level. Therefore, the PLA of the invention may be reprogrammed with only one mask.

Beside the embodiments of FIGS. 7 and 8, it is also possible to implement PLAs of a different type than the AND/OR type. For example, AND/AND and OR/OR PLAs, as well as pre-charge and evaluation PLAs may be implemented with either a single OR plane or a single AND plane.

In summary, advantages of the architecture of the present invention include reduced integration area, reduced cost, and increased performance. That is, the PLA according to the present invention occupies less space than known PLAs for the same combinatorial logic. Also, the use of only one mask in the reprogramming process reduces the costs of adjusting the contents thereof. Moreover, such a mask is one of the last masks that are used in the fabrication process and are relatively easy to make.

Additionally, the performance of a PLA according to the invention is better than that of prior art PLAs. Indeed, in prior art PLAs the timing is based on a dummy path, i.e., the slowest of all internal paths. The dummy path is implemented by connecting all the transistors of a column of the AND plane in series and by using only one transistor of the OR plane (with all the others acting as a parasitic load).

According to the present invention, all of the transistors of each column of the AND plane are connected, and there may be a case in which only one transistor of the OR plane is used. Therefore, the PLA of the invention "decides" within the time delay that would otherwise be set by a dummy path. In reality, the PLA of the present invention decides in a shorter time delay than known PLAs. This is because the length of the columns of the AND plane is practically halved since the number of the parasitic transistors is halved (i*p rather than 2*i*p), and so is the load. Therefore, the evaluation of the minterms is faster and the overall decision time is shorter.

According to the present invention, the evaluation time of the AND plane is uniform (i.e., equal for all the minterms) because each minterm sees the same number of transistors in series toward the power supply rail. In addition, the spread of the evaluation time of the OR plane is contained. This makes it possible to implement a PLA even without any DUMMY path, i.e., by using as pre-charge and evaluation command signals that are purposely generated and linked to the clock that drives the PLA itself.

That which is claimed is:

1. A programmable logic array (PLA) comprising:
   at least one AND plane comprising
   an array of transistors arranged in rows and columns, the transistors in each column being connected in series with each other, each transistor having a control terminal and a conduction terminal, the conduction terminals of the transistors at each end of the series of transistors being respectively connected to a supply voltage and to a voltage reference, and each transistor of a first row and of a last row of said array of transistors having its control terminal connected to respective enabling and disabling voltages; and
   first, second, and third control lines associated with each row of said array of transistors except the first and last rows, said first control line being connected to a first input value, said second control line being connected to an inverted first input value, and said third control line being connected to a voltage sufficient to keep the transistors of a row connected thereto in a state of conduction;
   each transistor of each of the rows except the first and last rows having its control terminal connected to one of said first, second, and third control lines.

2. The PLA of claim 1 further comprising a dummy column of transistors each corresponding to a row of said at least one array of transistors and having a control terminal; and wherein the control terminal of each transistor of said dummy column of transistors except for those corresponding to the first and last rows are connected to said third control line.

3. A programmable logic array (PLA) comprising:
   an array of transistors arranged in rows and columns, the transistors in each column being connected in series with each other, each transistor having a control terminal and a conduction terminal, the conduction terminals of the transistors at each end of the series of transistors being respectively connected to a supply and to a first reference, and each transistor of a first row and of a last row of said array of transistors having its control terminal connected to respective enabling and disabling signals; and
   first, second, and third control lines associated with each row of said array of transistors except the first and last rows, and first control line being connected to a first input value, said second control line being connected to an inverted first input value, and said third control line being connected to a second reference sufficient to keep the transistors of a row connected thereto in a state of conduction;
   each transistor of each of the rows except the first and last rows having its control terminal connected to one of said first, second, and third control lines.

4. The PLA of claim 3 further comprising a dummy column of transistors each corresponding to a row of said at least one array of transistors and having a control terminal; and wherein the control terminal of each transistor of said dummy column of transistors except for those corresponding to the first and last rows are connected to said third control line.

5. A method for using a programmable logic array (PLA) comprising an array of transistors arranged in rows and columns, the transistors in each column being connected in series with each other, each transistor having a control terminal and a conduction terminal, the conduction terminals of the transistors at each end of the series of transistors being respectively connected to a supply and to a first reference, and each transistor of a first row and of a last row of the array of transistors having its control terminal connected to respective enabling and disabling signals, the method comprising:

controlling the array using first, second, and third control lines associated with each row of the array of transistors except the first and last rows, the first control line being connected to a first input value, the second control line being connected to an inverted first input value, the third control line being connected to a second reference sufficient to keep the transistors of a row connected thereto in a state of conduction, and each transistor of each of the rows except the first and last rows having its control terminal connected to one of the first, second, and third control lines.

6. The method of claim 5 wherein the PLA further comprises a dummy column of transistors each corresponding to a row of the at least one array of transistors and having a control terminal; and wherein the control terminal of each transistor of the dummy column of transistors except for those corresponding to the first and last rows are connected to the third control line.

* * * * *